(12) United States Patent
Larsson et al.

(10) Patent No.: US 7,713,376 B2
(45) Date of Patent: May 11, 2010

(54) METHOD AND DEVICE FOR EXPOSING ELECTRONIC COMPONENTS

(75) Inventors: Andreas Larsson, Göteborg (SE); Miladin Palalic, Älvsjö (SE)

(73) Assignee: MYData Automation AB, Bromma (SE)

( * ) Notice: Subject to any disclaimer, the term of this patent is extended or adjusted under 35 U.S.C. 154(b) by 771 days.

(21) Appl. No.: 10/578,431

(22) PCT Filed: Nov. 3, 2004

(86) PCT No.: PCT/EP2004/012418

§ 371 (c)(1),
(2), (4) Date: Jan. 31, 2007

(87) PCT Pub. No.: WO2005/046302

PCT Pub. Date: May 19, 2005

(65) Prior Publication Data

US 2007/0241028 A1   Oct. 18, 2007

(30) Foreign Application Priority Data

Nov. 7, 2003   (EP) .................................. 03025596

(51) Int. Cl.
*B65H 5/28* (2006.01)
(52) U.S. Cl. .................. 156/344; 156/584; 221/25; 221/72; 221/87; 414/411; 414/416.05
(58) Field of Classification Search .......... 156/344, 156/584; 221/25, 72, 73, 79, 87; 414/416.01, 414/416.03, 416.05, 416.08, 425, 811
See application file for complete search history.

(56) References Cited

U.S. PATENT DOCUMENTS

| | | | | |
|---|---|---|---|---|
| 4,820,369 A | * | 4/1989 | Kubo | 156/344 |
| 6,402,452 B1 | * | 6/2002 | Miller et al. | 414/412 |
| 6,699,355 B2 | * | 3/2004 | Yman | 156/344 |
| 6,773,542 B2 | * | 8/2004 | Bergstrom et al. | 156/344 |
| 2003/0049109 A1 | | 3/2003 | Yman | |

FOREIGN PATENT DOCUMENTS

| | | |
|---|---|---|
| JP | 11-307991 A | 11/1999 |
| JP | 2000-091790 A | 3/2000 |
| JP | 2001 308587 A | 11/2001 |
| WO | WO 03/026374 A2 | 3/2003 |

* cited by examiner

*Primary Examiner*—Mark A Osele
(74) *Attorney, Agent, or Firm*—Birch, Stewart, Kolasch & Birch, LLP

(57) ABSTRACT

A method of exposing components, which are carried by a carrier tape (2), arranged in sequence along the carrier tape (2) and covered by a cover (3). The cover is attached to the carrier tape having a lower surface facing the sequence of components. The method is performed by, while feeding the carrier tape towards the picking position, separating a first portion of the cover from a first portion (31) of the carrier tape. Thereafter, guiding a thus loosened portion of the cover towards the second side of the carrier tape. Performing said guiding such that before reaching the picking position, while being raised to an upright position, the cover is automatically gathered by being folded, so that at least two portions of the lower surface of the cover face each other, thereby reducing the height of the cover.

20 Claims, 5 Drawing Sheets

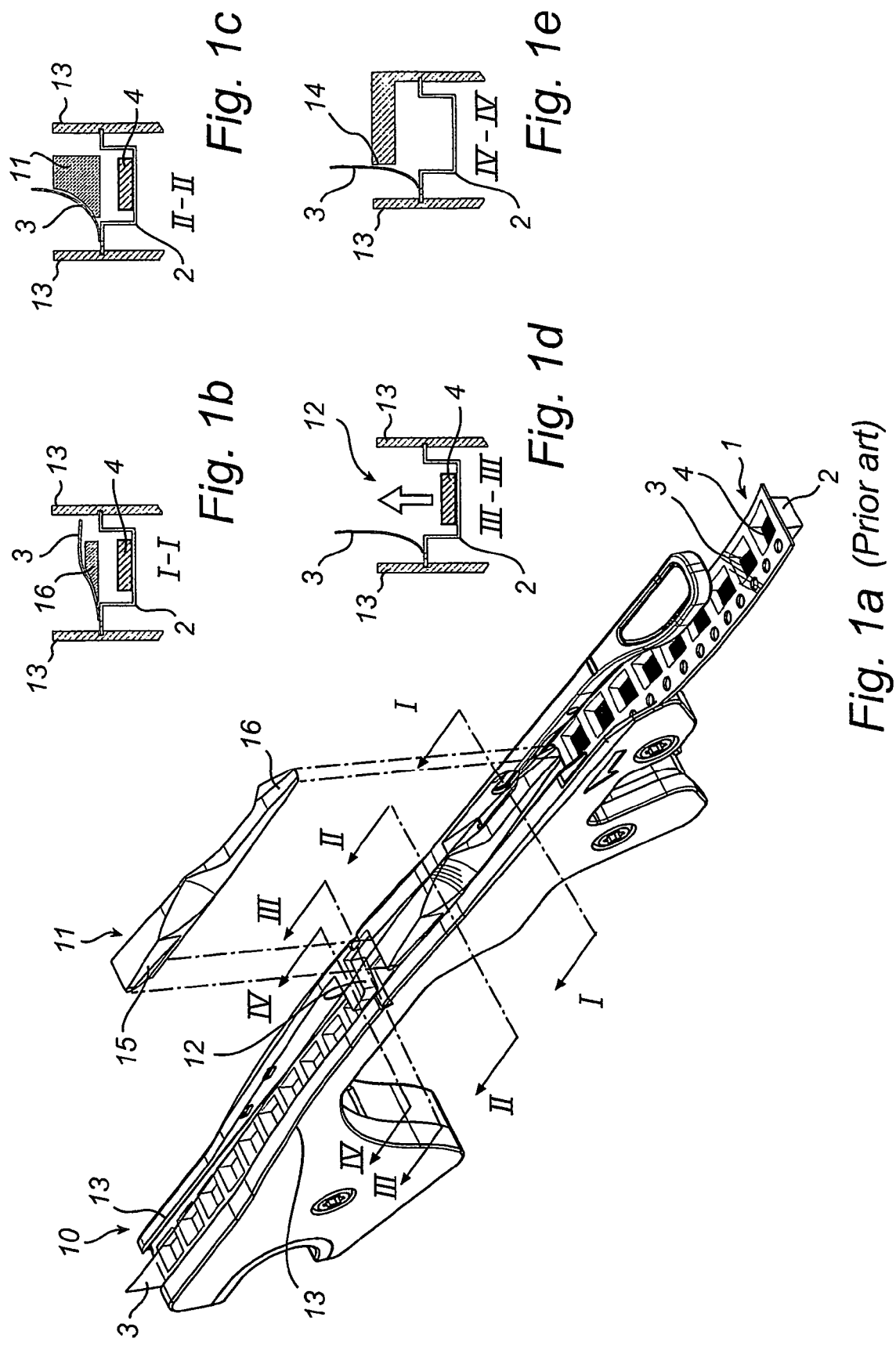

METHOD AND DEVICE FOR EXPOSING ELECTRONIC COMPONENTS

TECHNICAL FIELD OF THE INVENTION

The present invention generally relates to the field of manufacture and assembly of circuit boards. More specifically, the present invention relates to a method and a device for exposing components at a picking position in a component mounting machine, as well as a tape guide comprising such an exposure device.

TECHNICAL BACKGROUND AND PRIOR ART

Generally, within the field of manufacture and assembly of circuit boards, electronic components are fed to a component mounting machine for mechanically and/or electrically mounting of the components onto a circuit board. These surface mounted components are often delivered spaced apart along the length of a component tape, which consists of a lower carrier tape provided with compartments, one for each component, and an upper cover or cover tape or protective tape. After the positioning of the electronic components in the corresponding compartments, the cover tape is attached to the carrier tape, for instance by providing either the cover tape or the carrier tape with adhesive areas or by fusing the cover tape to the carrier tape, and the component tape is wound on a component reel. After having wound the component tape on a component reel, the reel is transferred to a component mounting machine, which feeds a component to a certain predetermined picking position where it can be picked, or collected, by a pick-up head.

WO 86/00778 shows a cassette magazine for a component mounting machine using the above described method. The main steps are as follows: introducing the free end of the component tape into a feeding mechanism, provided in the machine or in the magazine, such that feeding pins engage corresponding holes provided in the component tape. Separating, by hand, the end of the cover tape from the end of the carrier tape for a distance sufficient to attach the cover tape to a cover tape handling means. Bringing the cover tape end past a stripping edge which is combined with a plate or a locking mechanism that secures the carrier tape. Lowering the locking mechanism over the carrier tape for holding the carrier tape against the feeding mechanism. Bringing, by hand, the end of the cover tape, and attaching it, to the cover tape handling means; and stretching the cover tape, e.g. by manipulating the cover tape handling means.

Prior to the picking of the components, each component has to be exposed so as to make it available for picking. This is achieved by removing the cover tape from the carrier tape. The cover tape is then fed by separate cover tape handling means in order for the cover tape not to disturb the picking of components. Generally, the cover tape handling means comprises a winding hub on which the cover tape is wound. Additionally, when unloading the component tape from the component mounting machine, or the tape magazine, the winding hub has to be cleared of the cover tape.

A considerable length of the end of the cover tape has to be separated from the end of the carrier tape in order to bring the cover tape end to a cover tape handling means. Thus, the first decimeters of a new carrier tape are not provided with components. Otherwise, numerous components would be wasted during loading. However, when reloading a tape reel that has already been partly used, the tape is provided with components throughout, and consequently a large number of components might be wasted.

The most conventional way of exposing the components in a broad carrier tape, i.e. wider than 8 mm, is to use the method described above. The width of the carrier tapes ranges from 8 to 200 mm, where a width of 8, 12 or 16 mm is the most conventional. The properties of different carrier tapes and covers are well known, and do not differ much between different manufactures, as there is a US standard EIA-481 regulating the basics of component tapes. For example, the standard regulates the peeling force of the component tape, i.e. the force needed to separate the cover from the carrier tape. From this value conclusions can be drawn regarding the elasticity of the cover.

Component tapes having a narrow width, such as 8 mm, may be handled in a different way, described for example in WO 00/38491, where a tape guide is used, which can be loaded with the component tape away from the machine, and which thereafter can be inserted into said machine. When the tape guide is loaded by for example an operator, the component tape is first inserted between two opposing elongated walls of the tape guide. The tape is then manually fed towards a plough mounted on the tape guide, and when the component tape reaches the plough, the operator makes sure that the tip of the plough is inserted between the carrier tape and the cover. Moreover, the plough is further arranged such that when the operator manually continues to feed the component tape past the plough, the plough detaches one of the rim portions of the cover, which are attached to the component tape, but leaves the other rim portion still attached, and as the cover tape is fed further into the tape guide, the cover is raised to an upright position. In a further development of the tape guide, the cover is raised to an upright position by a plough.

In this context the term upright is referring to a direction, which is substantially perpendicular to the plane of the carrier tape, or which is turned further outwards, away from the picking position, thus forming an angle with the plane of the carrier tape of at least about 60 degrees. Here, the plane of the carrier tape is substantially parallel to the plane of the cover, as long as the cover is attached to the carrier tape.

The operator continues to feed the component tape along the tape guide, until the tape has reached a position, where feeding means in the component mounting machine can engage with the component tape, when the tape guide is loaded in the machine.

After the component tape, in the above described way, has been loaded into the tape guide, the tape guide, in turn, is loaded into the component mounting machine, such that a picking head in said machine can pick components from a picking position on the tape guide. The picking position is a position along the tape guide where the cover of the loaded component tape has been opened such that the components are unblocked.

As stated above, this type of tape guide is used for narrow tapes. When using wider tapes, for example 12 or 16 mm broad, raising the cover to an upright position can involve substantial drawbacks, due to the fact that a wide cover raised to an upright position requires a substantial amount of free space above the tape guide. If several tape guides are arranged side by side, the picking head is forced to pass higher above the guides, requiring an increased vertical distance to travel for the picking of components, and thus the time efficiency of the entire manufacturing process is decreased.

An alternative to raising the cover to an upright position, is to raise the cover completely to the side, i.e. turning the loosened part of the cover about 180 degrees, so that it extends beside the component tape. Although this method solves the above problem, it is not a true solution but merely a way of forwarding the problem to another area. Instead of requiring free space above the tape guides, the space is now needed to the side of each tape guide. When the cover is turned completely to the side, the tape guides have to be arranged further apart, so that one cover in one tape guide does not interfere with the neighboring guide.

An early attempt to solve the above problems is described in document U.S. Pat. No. 4,820,369. Here, a guide shoe is provided with tunnel shaped guide means, for causing a loosened portion of the cover tape to curve outwards, upwards and to the side of the picking position, by letting it run inside the guide means, such that at the picking position the loosened cover will be arranged almost in a spiral shaped fashion.

As reliability and efficiency are of great importance within the field of manufacture and assemble of circuit boards, the cover of the component tape simply can not be allowed to obstruct the picking process, or the feeding of the component tape, not even occasionally. If, for instance, the cover would get stuck under the plough in a tape guide, or if the cover would interfere with the picking position, a vast amount of irretrievable time is lost, while the problem is corrected and the component tape is reloaded into the tape guide, and hence the margins of the manufacturing process are reduced. Consequently, when using the tape guide for removing the cover in order to expose components one must make sure that the free rim portion of the cover is well away from the plough and the picking position.

SUMMARY OF THE INVENTION

It is an object of the present invention to eliminate, or at least alleviate, the described problems related to the opening of a component tape, using a tape guide. This object is achieved by a method and a device in accordance with the appended claims. Preferred embodiments are defined in the dependent claims.

The invention is based on an insight that it is favorable to gather the cover by folding it inside the tape guide, such that the loosened portion of the cover requires less space at the picking position.

In this document, the term folding means raising the cover inwards such that at least two portions of the lower surface of the cover face each other, is used. In this context, the lower surface of the cover refers to the surface facing the carrier tape. Advantageously, the folding is such that the portions facing each other at least substantially contact each other. The gathered cover may suitably have a cross section, which more or less describes an M or an inverted V. Once gathered, the cover will pass in an upright position at the side, and free from the picking position. Advantageously, the gathered cover is kept folded while passing the picking position by lateral wall means of the exposing device.

Unexpectedly, it has turned out that a conventional component tape cover of a certain width will gather itself automatically by folding, provided that a component exposing device in the tape guide has suitable physical and geometrical properties. Hence, provided a component tape with the proper properties and a correctly designed component exposing device, the cover will gather itself by folding, as it passes the exposing device, while being raised to an upright position.

The fact that a loose rim portion of the cover can cause severe damage, if it interferes with the plough or the picking position, makes the realization of the inventors, that it is possible to fold the cover inwards within the tape guide in a controlled way, yet the more advantageous. Especially, since the free rim portion of the gathered cover will be close to the sequence of components, when the cover has been folded.

Parameters of the component tape, which might have influence on whether the tape will be gathered automatically by folding or not, is for example the width and the elasticity of the loosened portion of the cover, as well as the surface friction of the upper and lower surface of the cover tape. Because the US standard EIA-481 regulates many of the parameters of the commonly used component tapes, it is possible to design an exposing device, which is able to handle most component tapes of a certain width on the market.

It is not known exactly why the cover folds itself as it does. It is believed that an underlying principle is the introduction of certain tensions in the loosened part of the cover, causing the cover to automatically fold itself. The tensions are introduced by guiding the rim portion of the cover in a controlled way towards the other side of the component tape. As a typical example, in a known tape guide designed for 8 mm tape, the plough comprises a tongue shaped element, which covers and keeps the components in their respective compartments, from where the cover is separated from the carrier tape up to the picking position and which guides the cover towards an upright position. The inventors have surprisingly found that for a typical cover tape, automatic folding will occur for a particular interval of the length of the tongue element, the lengths within the interval being substantially shorter than the length of previously known plough element. Moreover, the folding seems to improve the shorter the tongue element is, down to a certain limit. However, if the tongue element is made even shorter automatic folding might not occur.

It has been found that automatic folding will occur if the ratio R between the length and the width of the loosened portion of the cover is between about 2.5 and 6. The length of the loosened portion of the cover is the distance between a first point and a second point, when it is projected on a direction parallel to the feeding direction of the carrier tape. The first point is located where the exposing device separates the cover from the carrier tape. The second point is located on the second side of the sequence of components, where the cover is folded before the picking position. The width of the loosened portion of the cover is the transversal distance, i.e. the distance along a direction which is orthogonal to the sequence of components, between a first point and a second point. The first point is located on the second section of the carrier tape, i.e. where the cover is attached to the component tape on a second section of the sequence of components. The location of the second point is where the exposing device separates the cover from the carrier tape. Consequently, if measured correctly, the length is orthogonal to the width of the loosened portion of the cover.

The inventors have found that a preferred interval of the ratio between the length and the width of the loosened portion of the cover is between about 4 and 5, and an optimal value of the ratio is about 4.5.

A major problem with tape guides providing a very small ratio, is that they might cause the cover to separate from the carrier tape not only from the first side of the sequence of components, but from both sides. As a consequence, the loose portion of the cover might not follow the component tape past the exposing device, and might therefore interfere with the picking process.

There does not seem to be any substantial difference in folding behavior when using a ratio between about 4.5 and 6. Consequently, a ratio of about 4.5 is preferred to a greater one, as a shorter length does not leave as many filled component compartments partially open, when a component tape is removed from the tape guide in exchange for another component tape. Hence, the number of components suffering the risk of being wasted, when changing component tapes, is reduced.

There seems to be a relation between the above mentioned ratio and the force needed to cause the cover to pass through the tape guide as desired. This relation is most evident for ratios less than about 4.5. The relation seems to give: the smaller the ratio, the bigger is the force needed. Seen from this point of view, too small a ratio may be a disadvantage as it requires a larger force. If the ratio is less than about 2.5, the force needed may be too great to make a practical use of the tape guide in a component mounting machine realistic. Additionally, there is the problem of the exposing device detaching the cover from both sides of the sequence of components. However, a small ratio might still be an advantage from the component saving point of view, as explained above. Therefore, one should find a suitable compromise between the size of the ratio and the size of the force.

As the component tape is loaded in a tape guide in accordance with the invention, the cover displays a loading behavior, which may vary from time to time. However, after an initial amount of cover (typically between 0.5 to 2.5 dm) has passed the tape guide, a stable fold arises. It has been found that this fold can have different shapes, as indicated above, depending on the cover material and properties of the tape guide, ranging from a single fold (shaped like a V turned up side down), to a double fold (shaped like an M) or even a triple fold, as well as varieties of and stages in between these shapes.

Thus, according to a first aspect, the present invention provides a method in which the guiding of the cover of a component carrier tape in a tape guide is performed in such a way, that the cover is automatically folded inwards, in one or several folds within the tape guide, while it is raised to an upright position, before passing a picking position, so that at least two portions of the lower surface of the cover face each other, thereby reducing the height of the upright cover.

According to another aspect, the present invention provides a method in which the cover of a component carrier tape in a tape guide is guided in such a way that, before the separated rim portion of the cover reaches the picking position, the cover is folded inwards, while it is raised to an upright position, such that at least two portions of the lower surface of the cover face each other, thereby reducing the height of the cover. Thereafter, while the separated cover portion passes the picking position, the cover is kept gathered by the use of lateral wall means, arranged at the side of the picking position.

According to a third aspect, the present invention provides a device for exposing components of the cover of a component carrier tape in a tape guide, where means for guiding a loosened rim portion of the cover across the sequence of components is arranged such that before reaching a picking position, the cover has been raised to an upright position, and is automatically gathered by being folded inwards, thereby reducing the height of the upright cover.

According to a fourth aspect, the present invention provides a device for exposing components of the cover of a component carrier tape, which is further provided with means for gathering the cover by folding, while said cover is raised to an upright position, so that at least two portions of the lower surface of the cover face each other, thereby reducing the height of the cover. Moreover, the exposing device is provided with lateral wall means, which is arranged at the side of the picking position, for keeping the cover gathered while said cover passes the picking position. The cover remains gathered due to certain tensions, created in the cover at the picking position, by the part of the cover which has already passed the exposing device and now strives to fall back on to the carrier tape. It seems that these tensions are different from those described earlier and which cause the automatic folding. The fact that the cover strives to fall back on the carrier tape depends to some extent on a spring force action, which originates from the cover being folded.

According to a fifth aspect, the present invention provides a self-contained tape guide comprising an exposing device in accordance with the invention, for exposing components of the cover of a component carrier tape. This tape guide can be loaded independently outside the component mounting machine in accordance with the invention, and loaded into said component mounting machine such as described in WO 00/38491.

Care must be taken when designing the lateral wall means, allowing neither the rim portion of the cover to slip under said wall shaped means, nor the wall shaped means to separate the second rim portion of the cover from the carrier tape. Usually, there is a small gap between the wall means and the component tape. If the wall means are positioned closer than about 0.2 mm above the surface of the component tape, the second rim portion of the cover, attached to the carrier tape on the second side of the sequence of components, might accidentally be separated from the carrier tape. If the wall means are positioned higher than about 0.8 mm above the component tape, and/or if the distance between the separating means and the wall means is larger than about 1 mm, the cover might slip under the exposing means and interfere with the picking process.

Occasionally, the manufacturing of component tapes is not ideal, resulting in that portions of the rim portion of the cover is not attached to the carrier tape. A cover which is not completely attached to the carrier tape is difficult to load in a tape guide. One way of solving this problem is to start the loading with a part of the component tape, where the first about 0.5 to 1.5 dm of the cover is attached to the carrier tape. However, once the component tape is loaded, a tape guide according to the invention is able to handle occasional loose rim portions of the cover tape, such that they are brought the same way as the rest of the cover. This is especially the case if the exposing device comprises roof like means, which covers a slot like passage at the side of the picking position. The slot like passage can be formed by the lateral wall means of the exposing device in combination with an opposing portion of the tape guide wall. The purpose of the roof like means is to force the loose portions of the cover down inside the tape guide, by making the portion of the cover tape, which has already passed the picking position, pull the loose portion in under the wall like means.

Advantageously, when loading the tape guide a guiding surface of the exposing device, arranged between the point where the cover is separated from carrier tape and the picking position, extending across the sequence of components, assists in guiding a loosened rim portion of the cover to the second side of the sequence of components. The guiding surface is further designed such, that when the cover is guided from the first to the second side of the sequence of components, such tensions are introduced in the cover that it is automatically folded. The design of the guiding surface can be varied in order to better assist the loading of the component tape. For example, the angle between the plane of the component sequence and the plane of the guiding surface can be less than 90 degrees. Furthermore, the wall of the guide surface can be slightly curved instead of flat. The first portion of the guiding surface can for instance be slightly convex and the rear portion slightly concave.

Other objects and further features of the present invention will be apparent from the following detailed description.

BRIEF DESCRIPTION OF THE DRAWINGS

FIG. 1a is a perspective view of a known tape guide, which is provided with a plough and loaded with a narrow carrier tape. Additionally, the figure comprises an exploded view of the plough;

FIG. 1b-1e are schematic transversal cross-sectional views taken at four different sections of the tape guide, which is shown in FIG. 1a, illustrating parts of the tape guide, the plough, the carrier tape and a component, where present;

FIG. 3a is a schematic perspective view of a component tape, the cover of which engages a guiding surface of an exposing device, when loading the component tape in accordance with one embodiment of the invention;

FIG. 3b is a schematic transversal cross-sectional view taken at I-I in FIG. 3a;

DETAILED DESCRIPTION OF A PREFERRED EMBODIMENT

Figure 2A:
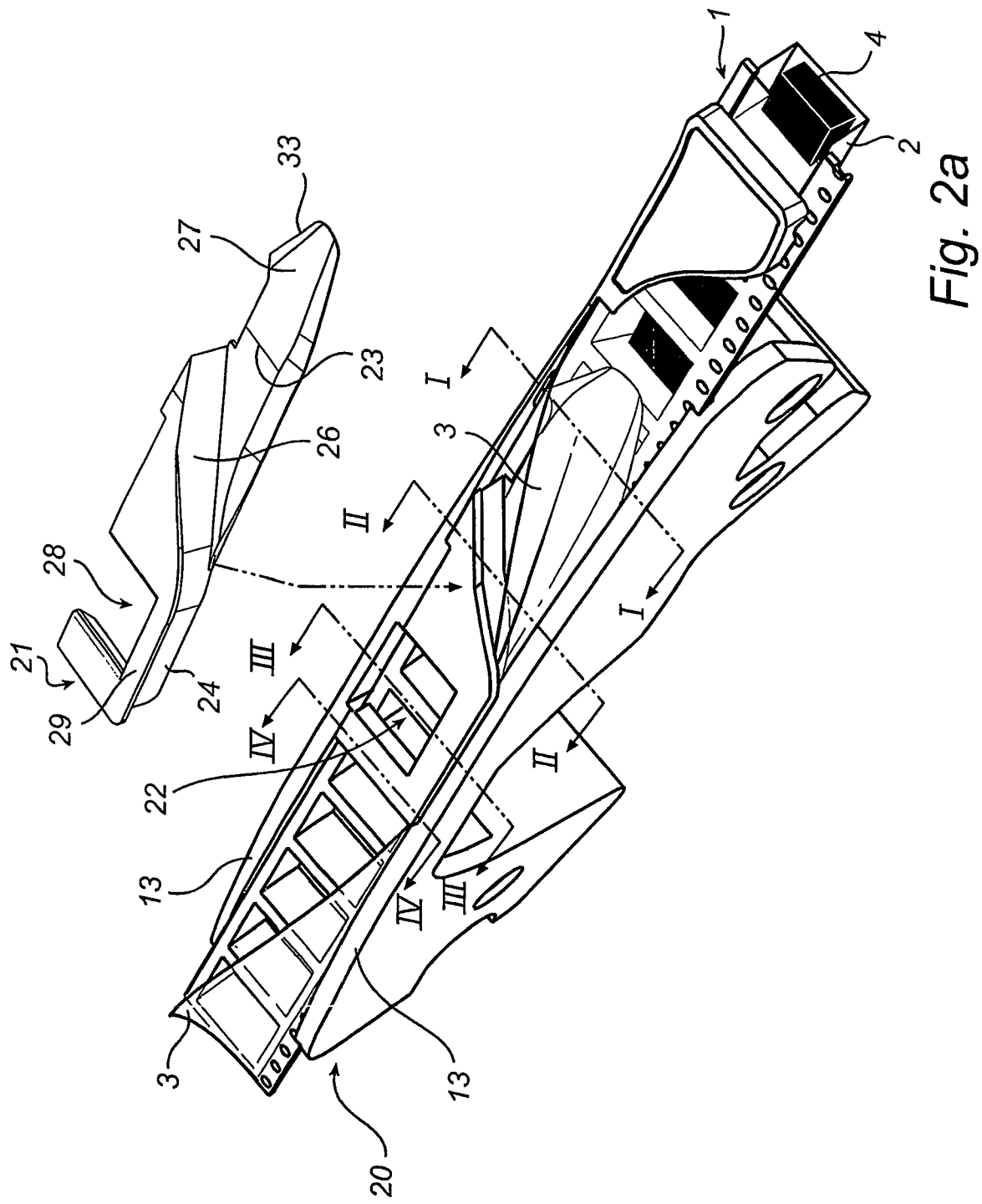
FIG. 2a is a perspective view of a tape guide in accordance with one embodiment of the present invention, which is provided with an exposing device and loaded with a broader carrier tape. Additionally, the figure comprises an exploded view of the exposing device.

Description will be given of a prior art tape guide and an embodiment according to the present invention, wherein like reference characters designate like or corresponding parts throughout the figures.

In FIG. 1a a tape guide 10 belonging to the state of the art is shown, which is designed for turning a cover 3 of a narrow component tape 1, having a typical width of 8 mm, to an upright position, and thereby sequentially exposing the carried components 4 at a picking position 12. The component tape 1 comprises a carrier tape 2, which has pockets carrying the components 4, and the cover 3. The components and the pockets are only indicated schematically in the figures. In reality the size of the pockets is adjusted to fit the size of the components. However, the component tape, is loaded into the tape guide 10 by first separating a small part of the cover 3 from the carrier tape 2 at a first side of the sequence of components. Thereafter, the component tape 1 is put into the tape guide 10 between two side walls 13 of the tape guide, while it is made sure that the tip 16 of a tape guide plough 11 is inserted between the carrier tape 2 and the separated part of the cover 3. Next the component tape 1 is pulled and/or pushed passed the plough 11, such that the cover 3 is further separated from the carrier tape 2 only on said first side of the sequence of component. While passing the plough, the cover 3 is raised to an upright position at the side of a picking position 12. While raised to this upright position the carrier tape is supported by a plough support surface 15, provided on the plough just before the picking position 12, and a support surface 14, arranged just after the picking position 12 and provided on an upper projection extending laterally from the side walls 13. These support surfaces 14, 15 have an elevated position compared to the carrier tape 2. After having inserted the thus loaded tape guide 10 into a component picking machine, a picking head is able to sequentially pick an exposed component 4 at the picking position 12.

FIGS. 1b, 1c 1d and 1e are schematic cross-sectional views along the lines I-I, II-II, III-III, and IV-IV, respectively. The figures show the tape guide walls 13, the carrier tape 2, the cover 3 and the plough 11 as well as a component 4, if present. The views illustrate the different positions of the cover along the tape guide 10, when the cover 3 is raised to an upright position by the plough 11, after being separated from the carrier tape 2 by the tip of the plough 11.

In FIG. 1d the picking position 12 and the fully raised position of the cover 3 is shown. While the cover 3 is raised to an upright position at the side of the picking position 12, a picking head is able to pick up a component 4, as indicated by an arrow.

FIG. 1e illustrates the location of the cover support surface 14 after the picking position 12, said surface having a small height and an elevated position.

In FIG. 2a a modified tape guide 20 for a broader component tape is shown, which is provided with an exposing device 21 in accordance with an embodiment of the invention. The exposing device has a tongue shaped element 23, which is substantially flat, thin and extends substantially parallel to the sequence of components. The tongue element is provided with a rounded tip 27, which on a first side of the sequence of components is provided with lateral knife shaped means 33, for separating the cover 3 from a first portion of the carrier tape 2 on a first side of the tape guide. The tongue shaped element 23 covers the components 4 from the point where the cover is separated from the carrier tape towards the picking position 22.

The exposing device also comprises a guiding element having a guiding surface 26, which is substantially orthogonal to the tongue shaped element 23. The guiding element is arranged at the picking position 22. The guiding surface 26 extends substantially from said first side to the second side of the tape guide, obliquely towards the picking position 22, in order to guide—when loading a component tape into the tape guide—a loosened portion of the cover 3. The exposing device 21 is designed such that as the cover 3 moves towards second side of the tape guide and thus the second side of the sequence of components, certain tensions are introduced into the cover 3, which brings the cover 3 to be gathered by folding as herein before defined. Thus, the folding appears due to the tensions introduced when the loosened rim portion of the cover 3 is guided by the guiding surface 26 towards the second side of the sequence of components.

The exposing device 21 is also provided with wall means 24, which extends from the second end of the guiding surface 26 past the picking position 22 on the second side of the tape guide. The wall means 24 are substantially orthogonal to the carrier tape and parallel to the feeding direction of the carrier tape 2. The main purpose of the wall means 24 is to secure that the gathered cover 3 remains gathered and to the side of the picking position 22, while it passes the picking position 22. Thus, the components will be safely exposed for the picking head. This is further illustrated in relation to FIG. 3 and FIG. 4.

The exposing device 21 is further provided with roof like means 29, which is parallel to the carrier tape and arranged at the side of the picking position 22 and covering the gathered cover 3 as it passes the picking position 22 through a slot like passage, between the wall means 24 and the tape guide wall 13 on the second side of the tape guide. The roof like means 29 is also described further in relation to FIG. 2d and FIG. 2e.

Figure 2B:
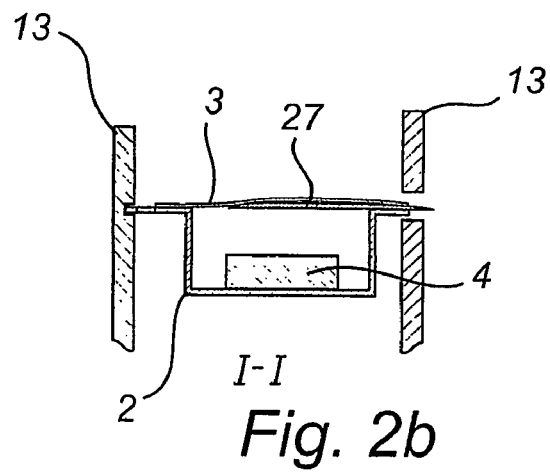
FIG. 2b-2e are schematic transversal cross-sectional views taken at four different sections of the tape guide, which is shown in FIG. 2a, illustrating parts of the tape guide, the exposing device, the carrier tape and a component, where present.
Figure 2C:
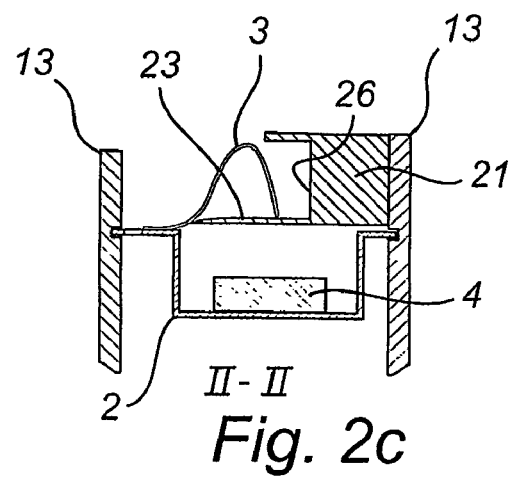
Figure 2D:
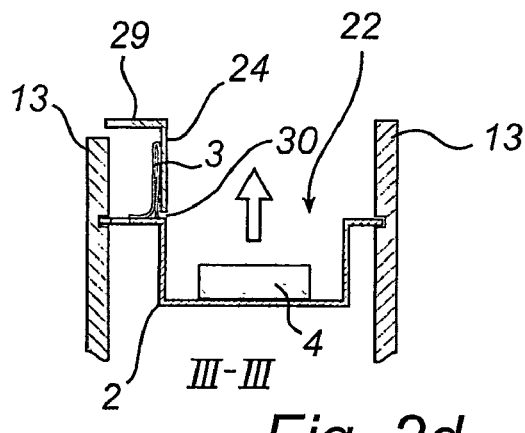

FIGS. 2b, 2c and 2d are schematic cross-sectional views along the lines I-I, II-II, III-III, and IV-IV in FIG. 2a, respectively. The figures show the exposing device 21, the tape guide walls 23, the carrier tape 2, the cover 3 and a component 4, if present. The views illustrate the gathering by inwards folding of a cover 3, and the securing of the fold of the gathered cover at the side of the picking position 22.

In FIG. 2b the tip 27 of the exposing device 21 has just separated the cover 3 from the carrier tape 2 on the first side of the sequence of components 4.

In FIG. 2c the cover 3 is gathered by being folded. One may note that the guiding surface 26 of the exposing device 21 is no longer in contact with the cover 3 of the loaded carrier tape.

FIG. 2d illustrates the situation at the picking position 22. The gathered cover 3 is kept at the side of the picking position, by the lateral wall means 24 of the exposing device 21, thus enabling for the picking head to pick up a component 4. The roof like means 29 keeps the gathered cover safely in the slot like passage between wall means 24 and the tape guide wall 13.

Figure 2E:
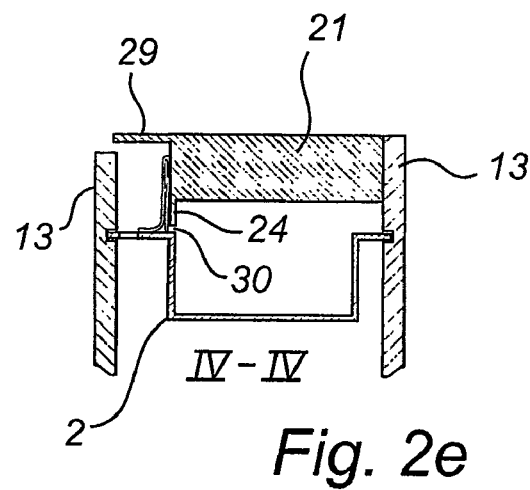

FIG. 2e illustrates the situation after the picking position 22, the cover being kept gathered as in FIG. 2d.

Additionally, in FIGS. 2d and 2e there is illustrated a gap 30 between the upper surface of the carrier tape 2, on which the cover is attached, and the lower edge of the lateral wall means 24 of the exposing device 21. It has been found that if the gap 30 is made too small, there is a risk that the cover 3 will be separated from the carrier tape 2 also on the second side of the sequence of components, and may obstruct the function of the exposing device, and hence prevent the carrier tape to be fed further along the tape guide. On the other hand, if the gap is made too large, there is a risk that the loosened rim portion of the gathered cover 3 slips under the lateral wall means 24, towards the picking position 22, thereby interfering with the picking of components. Thus, in both cases the loosened portion of the cover 3 might disturb either the feeding or the picking process, respectively.

It is sometimes advantageous to use a cover tape of the PSA ("Pressure Sensitive Adhesive") type. Due to material properties and the manufacturing process, portions of the lower surface, which faces the components when the cover is attached to the carrier tape, is still adhesive, even after the cover has been separated from the carrier tape 2. Hence, when folding the lower surface portions of the cover 3 together, the adhesive portions may attach to the rest of the lower cover surface. The main advantage of a folding in accordance with the invention is that the friction between the plough and the lower surface of cover is substantially reduced, as only the non-adhesive, upper surface of the cover engages the exposing device. Another advantage might be the fact that the separated rim portion of the cover 3 will be adhesively attached to the lower surface of the cover 3 on the second side of the sequence of components, and therefore makes it less probable that the loosened rim portion of the cover 3 will obstruct the picking position 22.

Figures 3A, 3B:
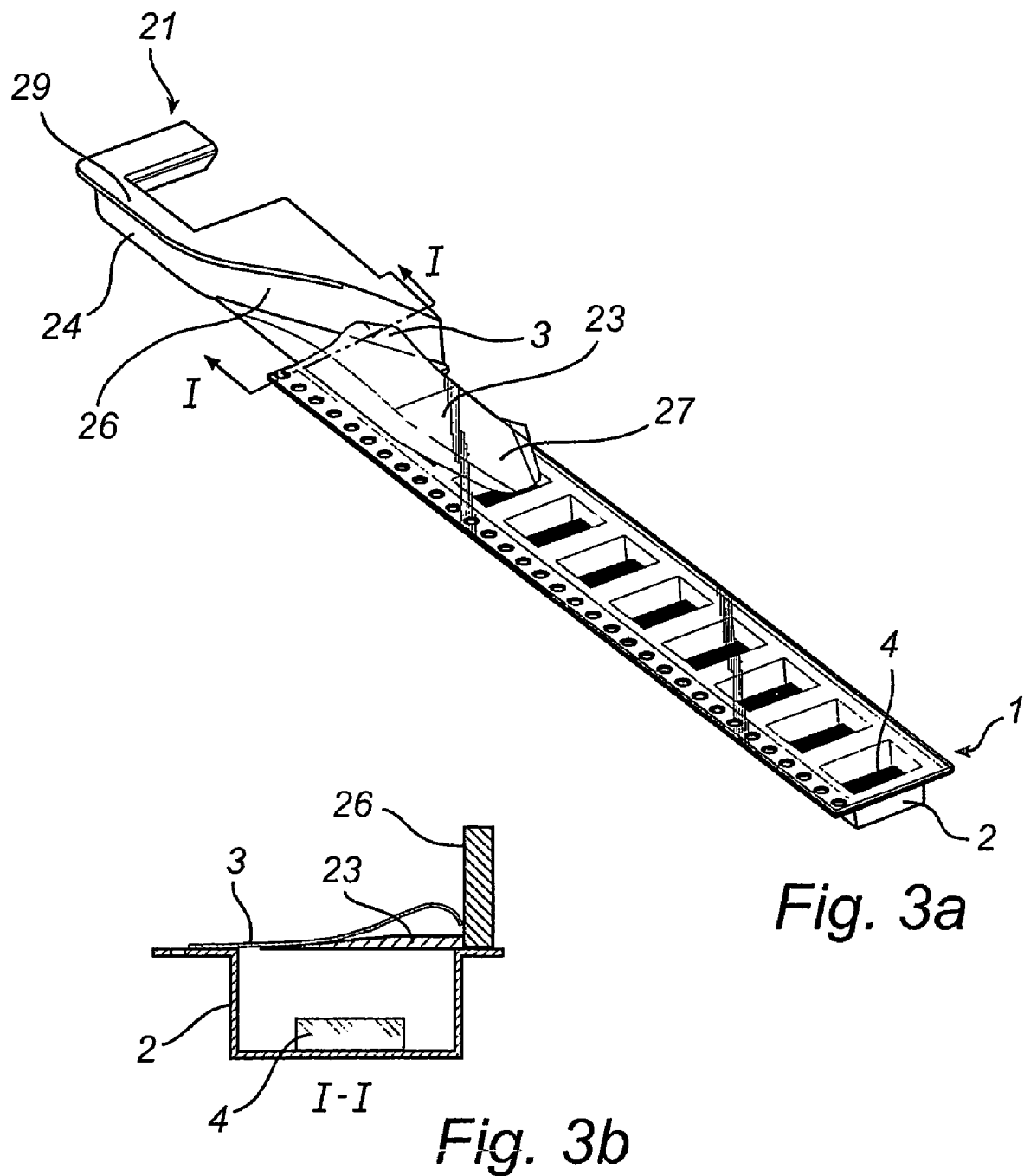

FIG. 3a is a schematic view illustrating the initial co-action between the component tape 1 and the exposing device 21 during the loading of a component tape 1 into a tape guide as shown in FIG. 2a, according to one embodiment of the invention. The rest of the tape guide has been left out in order to make the principle of the loading more clear to the reader. As usual, the loading of a tape guide first involves a manual separation of a small part of the cover 3 from the first side of the carrier tape 2. Thereafter, the component tape 1 is inserted into the tape guide, in such a way that the tip 27 of the exposing device 21 is positioned between the loosened cover 3 and the carrier tape 2. Subsequently, the component tape 1 is pushed or pulled along the tape guide, and after some distance the loosened rim portion of the cover 3 makes contact with the guiding surface 26 of the exposing device 21, whereby said loosened rim portion of the cover is raised further as can be seen in FIG. 3b.

As the component tape during the loading is pushed or pulled past the guiding surface 26, the surface guides the loosened cover 3 of the component tape to the second side of the sequence of components, while causing a further folding of the cover. The tape is then further pushed or pulled past the picking position 22. After a certain length of the component tape 1 has passed the exposing device 21, the cover 3 has been automatically gathered as herein before defined, and is kept gathered by the exposing device. In this context automatically is referring to a folding which is achieved without the assistance of additional measures, such as manual folding of the cover or the like.

Figure 4:
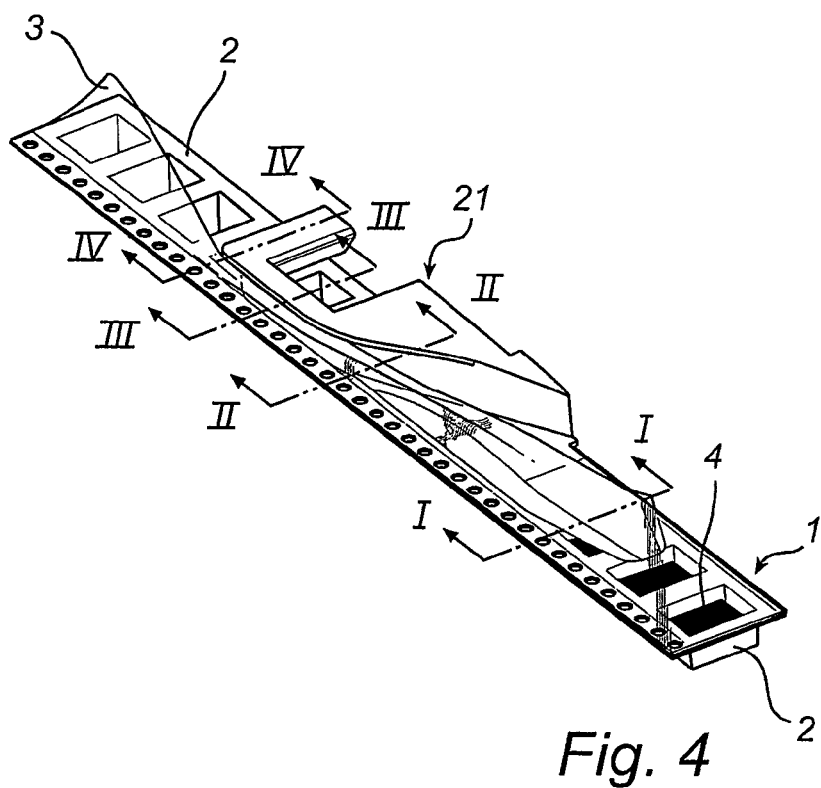
FIG. 4 is a perspective view of the exposing device and the carrier tape shown in FIG. 2, illustrating the guiding of the cover past the component picking position.

FIG. 4 is a perspective view further illustrating the co-action between the loaded component tape 1 and the exposing device 21, the exposing device 21 being arranged in a tape guide as shown in FIG. 2a. The rest of the tape guide has been left out in order to make the principle of how the cover 3 of a component tape is folded more clear to the reader. As mentioned in relation to FIG. 3a, after an initial length of the tape has been brought past the exposing device 21, the exposing device automatically gathers the cover 3 by folding, such that portions of the lower side of the cover 3 face each other. As previously mentioned, the exposing device 21 is provided with lateral wall means 24, the purpose of which is to keep the cover 3 folded as the cover 3 passes to the side of the picking position 22. It is believed that when the cover 3 is folded and brought past the lateral wall means, it will stretch somewhat around said wall means 24, due to a spring force action of the folded cover 3, which strives to unfold and regain its original position on top of the carrier tape 2. Hence, as the cover 3 is stretched around the lateral wall means 24, it will remain folded when it passes the picking position 22.

As also mentioned, the exposing device 21 is provided with roof like means 29. The main purpose of the said means 29 is to act as a safety device, if the cover 3 for some reason, for instance due to a failure in the manufacturing process, should cease being attached to the second portion of the carrier tape 2. The roof means should bring this loose second portion to pass under the roof like means, by a pulling force exerted by a portion of the cover, which is attached to the second portion of the carrier tape and which has already passed under the roof like means.

Figure 5:
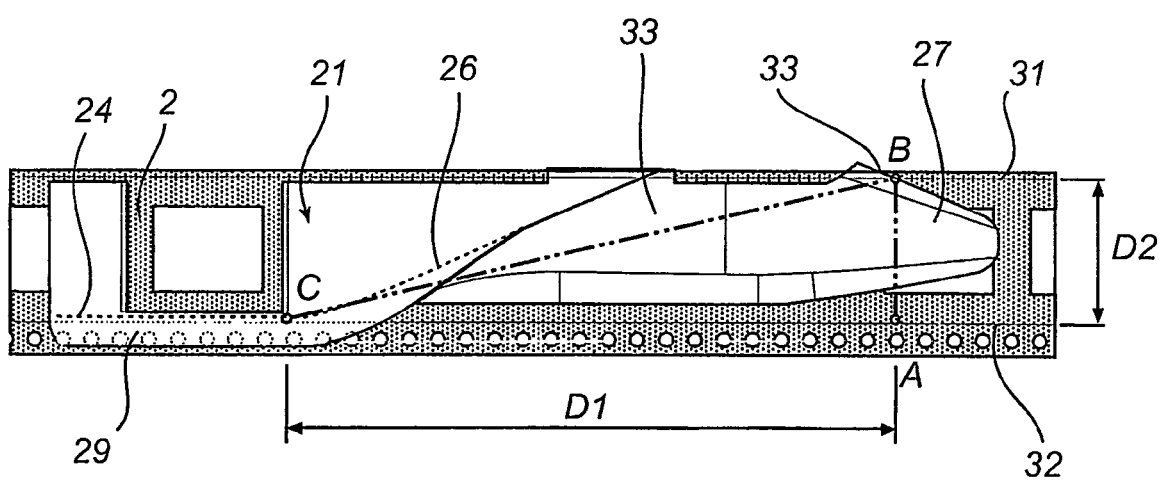
FIG. 5 is a schematic view from above of a carrier tape and the exposing device according to the invention, illustrating a ratio feature.

FIG. 5 is a top view, which schematically shows a carrier tape 2 and a co-operating exposing device 21 in accordance with one embodiment of the invention, in order to illustrate two distances D1 and D2, which are used for computing a ratio R between a length and a width of the loosened portion of the cover, which is of importance in order to obtain an automatic folding in accordance with the invention.

The length D1 of the loosened portion of the cover 3 is the distance BC between a point B and a point C, when it is projected on a direction parallel to the feeding direction of the carrier tape 2. Point B is located where the tongue shaped element 23 of the exposing device 21 separates the cover 3 from the carrier tape 2, i.e. at the point where the tip of element 23 crosses a first portion 31 of the carrier tape 2. In this context the first portion 31 of the carrier tape is where the cover 3 is attached to the carrier tape 2 on the first side of the sequence of components. Point C is located on the opposite second side of the sequence of components 4, where the cover has been folded just before the picking position 22, i.e. in this embodiment where the guiding surface 26 and the wall means 24 of the exposing device 21 meet.

The width D2 of the loosened portion of the cover 3 is the transversal distance, i.e. a distance along a direction which is orthogonal to the sequence of components, between a point A and the point B. Point A is located on a second portion 32 of the carrier tape 2, i.e. where the cover is attached to the carrier tape 2 on the second side of the sequence of components, directly opposite to point B. Consequently, the length D1 is measured orthogonally to the width D2.

It has been found that in order to be able to obtain a proper folding, and in particular an automatic folding as discussed above, of the cover in accordance with the invention, the exposing device should give a ratio R=D1/D2 which is between about 2.5 and 6, preferably between about 4 and 5, and even more preferred about 4.5.

It should be noted that a corresponding ratio of a prior art tape guide provided with a conventional plough, such as a tape guide as shown in FIG. 1a, has a typical value of about 10.

Hereinafter follows as an example a more detailed description of a preferred configuration of a self-contained exposing device to be used in a tape guide of the kind shown in FIGS. 1a and 2a, and suitable for handling a 16 mm component tape having a typical size of the pockets. The tongue shaped element 23 of the exposing device unit is about 65 mm long, about 12 mm broad and has a somewhat triangularly shaped tip 27 with a rounded end portion and a side that is somewhat knife or wedge shaped.

A guiding section is arranged just on top of the rear part of the tongue shaped element 23 and is provided with a picking position opening 28. The picking position opening 28 is arranged behind the tongue element, in the feeding direction, and the size of the opening is 15 mm in the tape feeding direction, and 12 mm in the transversal direction.

The guiding section is also provided with the vertical guiding surface 26, which starts about 15 mm behind the separating portion 33 of the tongue element on the same side of the exposing element, and ends on the opposite side of said exposing element about 35 mm further along the exposing 21 device in the feeding direction. The guiding surface forms an angle with the feeding direction of about 25 degrees. The guiding surface is about 10 mm high, substantially flat, orthogonal to the tongue shaped element and rounded at the portion which transitions into the wall means.

The wall means 24 starts about 3 mm before picking position opening 28, is about 25 mm long, about 10 mm high, about 0.4 mm thick and arranged about 0.5 mm above the plane of the lower surface of the tongue shaped element 23, which surface is facing the components. Additionally, the wall means continues about 5 mm in the feeding direction after the picking position opening.

Further there is a section, behind the picking position opening in the feeding direction of the exposing device, which is about 5 mm long in the feeding direction and about 5 mm high. The purpose of said section is to form as a support and stabilizer to the rear part of the wall means.

The roof means extends laterally from the upper edge of the wall means 24 about 4 mm, extends that is from the picking position opening 28 and has a lateral width of about 4 mm. The length of said roof means is about 35 mm, of which about 10 mm extends behind the picking position in the feeding direction. Also, the roof means extends along the last of the guiding surface, i.e. in a direction towards the other side of the exposing device.

The configuration of one type of exposing device is suggested above. However, other configurations are possible and can be considered without extending beyond the scope of the invention, as defined by the accompanying claims. For instance, a fin could be mounted on the tongue element of the exposing device in order to facilitate the initial folding of the cover, or the exposing device may not be a self-contained unit, but rather formed by a combination of separate parts.

Also, if an automatic folding of the cover when loading a component tape is considered to be of less interest, the exposing device can be designed merely to secure that an initial manual inwards folding of the cover provided during loading is maintained during the subsequent feeding of the component tape past and to the side of the picking position as herein described. As should be realized, such a design means that a specific guiding surface for the loosened cover is not necessary.

Furthermore, the use of an exposing device according to the present invention does not necessarily require the use of a self-contained tape guide of the kind described herein.

The invention claimed is:

1. A method of exposing components (4), carried by a carrier tape (2) at a picking position (22),
    the components being positioned in sequence along the carrier tape and covered by a cover (3),
    the cover being attached to the carrier tape at a first and a second rim portion of the cover, which rim portions are arranged on a first and a second side of the sequence of components, respectively,
    the cover having a lower surface facing the sequence of components, and
    the carrier tape having a first portion (31) and a second portion (32) to which said first and second rim portion of the cover is attached, respectively, comprising the steps of:
    while feeding the carrier tape towards the picking position, separating said first rim portion of the cover from said first portion of the carrier tape, and guiding a thus loosened portion of the cover towards the second side of the carrier tape, so as to expose the components at the picking position, and
    performing said guiding such that before reaching the picking position, while being raised to an upright position, the cover is automatically gathered by being folded, so that at least two portions of the lower surface of the cover face each other, thereby reducing the height of the cover.

2. A method according to claim 1, which further includes the step of guiding the cover (3) so that tensions are introduced in said cover, which tensions cause the cover to gather by said folding.

3. A method according to claim 1, which further comprises the step of guiding the cover (3), such that the ratio (R) between:
    a first distance (D1), which is the distance (BC) between a first point (B), where the cover is separated from the carrier tape (2), and a second point (C) on the second side of the sequence of components (4), where the cover has been gathered by being folded, while raised to an upright position, such that at least two portions of the lower surface of the cover face each other, when said distance (BC) is projected on a direction parallel to the feeding direction of the carrier tape, and
    a second distance (D2), which is the transversal distance (AB) from said first portion of the carrier tape substantially up to said second portion of the carrier tape along the lateral direction, is between about 2.5 and 6, preferably between about 4 and 5, and more preferred about 4.5.

4. A method of exposing components (4), carried by a carrier tape (2) at a picking position (22),
the components being positioned in sequence along the carrier tape and covered by a cover (3),
the cover being attached to the carrier tape at a first and a second rim portion of the cover, which rim portions are arranged on a first and a second side of the sequence of components, respectively,
the cover having a lower surface facing the sequence of components, and
the carrier tape having a first portion (31) and a second portion (32) to which said first and second rim portion of the cover is attached, respectively, comprising the steps of:
while feeding the carrier tape towards the picking position, separating said first rim portion of the cover from said first portion of the carrier tape,
guiding a thus loosened portion of the cover towards the second side of the carrier tape,
before said separated rim portion of the cover reaches the picking position, gathering said cover by folding, while it is raised to an upright position, such that at least two portions of the lower surface of the cover face each other, thereby reducing the height of the cover, and
keeping the cover gathered by the use of wall means (24), which is arranged at the second side of the picking position, while said cover passes the picking position.

5. A device for exposing components (4), carried by a carrier tape (2) at a picking position (22),
the components being positioned in sequence along the carrier tape and covered by a cover (3),
the cover being attached to the carrier tape at a first rim portion and a second rim portion of the cover, which rim portions are arranged on a first and a second side of the sequence of components, respectively,
the cover having a lower surface facing the sequence of components, and
the carrier tape having a first portion (31) and a second portion (32) to which said first and second rim portion of the cover is attached, respectively, comprising:
means (33) for separating said first rim portion of the cover from the first portion of the carrier tape, and means for guiding (26) a thus loosened portion of the cover towards the second side of the carrier tape, while the cover is being fed towards said picking position, so as to expose the components at the picking position, wherein
said means for guiding said loosened portion of the cover is arranged such that before reaching said picking position, the cover is raised to an upright position, and automatically gathered by being folded, so that at least two portions of the lower surface of the cover face each other, thereby reducing the height of the cover.

6. A device according to claim 5, wherein said means for separating (33) a rim portion of the cover (3) and said means for guiding (26) said loosened portion of the cover are arranged so, that they introduce such tensions in the cover, that the cover is gathered by said folding.

7. A device according to claim 5, further comprising wall means (24) arranged at the side of the picking position (22) for keeping the cover (3) gathered while said cover passes the picking position.

8. A device according to claim 7, wherein the wall means (24) is substantially parallel to the feeding direction of the carrier tape (2).

9. A device according to claim 7, wherein the wall means (24) also comprises roof like means (29), covering a slot like passage, being formed by the wall means (24) and a portion of the tape guide wall (13), through which passage the gathered cover tape (3) passes at the side of the picking position (22).

10. A device according to claim 7, wherein said means for separating (33) a rim portion of the cover (3) and said means for gathering the cover by folding are arranged such that the ratio (R) between:
a first distance (D1), which is the distance (BC) between a first point (B), where the cover is separated from the carrier tape, and a second point (C) on the second side of the sequence of components (4), where the cover has been gathered by being folded, while it was raised to an upright position, such that at least two portions of the lower surface of the cover face each other, when said distance (BC) is projected on a direction parallel to the feeding direction of the carrier tape and
a second distance (D2), which is the transversal distance (AB) from said first portion (31) of the carrier tape substantially up to said second portion of the carrier tape along the lateral direction is between about 2.5 and 6, preferably between about 4 and 5, and more preferably about 4.5.

11. A tape guide comprising an exposing device according to claim 5, wherein said tape guide is a self contained unit.

12. A device for exposing components (4), carried by a carrier tape (2) at a picking position (22),
the components being positioned in sequence along the carrier tape and covered by a cover (3),
the cover being attached to the carrier tape at a first and a second rim portion of the cover, which rim portions are arranged on a first and a second side of the sequence of components, respectively,
the cover having a lower surface facing the sequence of components, and
the carrier tape having a first portion (31) and a second portion (32) to which said first and second rim portion of the cover is attached, respectively, comprising:
means for separating (33) said first rim portion of the cover from the first portion of the carrier tape, and means for guiding (26) a thus loosened portion of the cover towards the second side of the carrier tape, while the carrier tape is being fed towards the picking position,
means for gathering the cover by folding, while said cover is raised to an upright position, so that at least two portions of the lower surface of the cover face each other, thereby reducing the height of the cover, and
wall means (24), which is arranged at the side of the picking position, for keeping the cover gathered while said cover passes the picking position.

13. A device for exposing components, carried by a carrier tape (2) at a picking position,
the components being positioned in sequence along the carrier tape and covered by a cover,
the cover being attached to the carrier tape at a first rim portion and a second rim portion of the cover, which rim portions are arranged on a first and a second side of the sequence of components, respectively,
the cover having a lower surface facing the sequence of components, and
the carrier tape having a first portion and a second portion to which said first and second rim portion of the cover is attached, respectively, comprising:
a separator for separating said first rim portion of the cover from the first portion of the carrier tape, and a guide which guides a thus loosened portion of the cover towards the second side of the carrier tape, while the cover is being fed towards said picking position, so as to expose the components at the picking position, wherein said guide is arranged such that before it reaches said picking position, the cover is raised to an upright position, and automatically gathered by being folded, so that at least two portions of the lower surface of the cover face each other, thereby reducing the height of the cover.

14. A device according to claim 13, wherein said separator and said guide are arranged so, that they introduce such tensions in the cover, that the cover is gathered by said folding.

15. A device according to claim 13, wherein a wall is arranged at the side of the picking position for keeping the cover gathered while said cover passes the picking position.

16. A device according to claim 15, wherein the wall (24) is substantially parallel to the feeding direction of the carrier tape.

17. A device according to claim 15, wherein the wall comprises a roof portion, covering a slot like passage, which is formed by the wall and a portion of the tape guide wall, through which passage the gathered cover tape passes at the side of the picking position.

18. A device according to claim 13, wherein said separator for separating a rim portion of the cover and said gathering unit for gathering the cover by folding are arranged such that the ratio between:

a first distance (D1), which is the distance between (BC) a first point (B), where the cover is separated from the carrier tape, and a second point (C) on the second side of the sequence of components, where the cover has been gathered by being folded, while it was raised to an upright position, such that at least two portions of the lower surface of the cover face each other, when said distance (BC) is projected on a direction parallel to the feeding direction of the carrier tape, and a second distance (D2), which is the transversal distance (AB) from said first portion of the carrier tape substantially up to said second portion of the carrier tape along the lateral direction is between about 2.5 and 6, preferably between about 4 and 5, and more preferably about 4.5.

19. A tape guide comprising an exposing device according to claim 13, wherein said tape guide is a self contained unit.

20. A device for exposing components, carried by a carrier tape at a picking position, the components being positioned in sequence along the carrier tape and covered by a cover, the cover being attached to the carrier tape at a first and a second rim portion of the cover, which rim portions are arranged on a first and a second side of the sequence of components, respectively, the cover having a lower surface facing the sequence of components, and the carrier tape having a first portion and a second portion (32) to which said first and second rim portion of the cover is attached, respectively, comprising:

a separator for separating said first rim portion of the cover from the first portion of the carrier tape, and a guide for guiding a thus loosened portion of the cover towards the second side of the carrier tape, while the carrier tape is being fed towards the picking position, a gathering unit for gathering the cover by folding, while said cover is raised to an upright position, so that at least two portions of the lower surface of the cover face each other, thereby reducing the height of the cover, and a wall, which is arranged at the side of the picking position, for keeping the cover gathered while said cover passes the picking position.

\* \* \* \* \*